(12) United States Patent
Li et al.

(10) Patent No.: US 12,425,029 B2
(45) Date of Patent: Sep. 23, 2025

(54) SIGNAL DRIVING SYSTEM WITH CONSTANT SLEW RATE

(71) Applicant: Institute of Microelectronics, Chinese Academy of Sciences, Beijing (CN)

(72) Inventors: Zhi Li, Beijing (CN); Jianzhong Zhao, Beijing (CN); Yumei Zhou, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 203 days.

(21) Appl. No.: 18/258,706

(22) PCT Filed: Dec. 25, 2020

(86) PCT No.: PCT/CN2020/139546
§ 371 (c)(1),
(2) Date: Jun. 21, 2023

(87) PCT Pub. No.: WO2022/134042
PCT Pub. Date: Jun. 30, 2022

(65) Prior Publication Data
US 2024/0305297 A1 Sep. 12, 2024

(51) Int. Cl.
*H03K 19/0175* (2006.01)
(52) U.S. Cl.
CPC .................. *H03K 19/0175* (2013.01)
(58) Field of Classification Search
CPC ............ H03K 4/02; H03K 19/00369; H03K 19/0175; H03K 3/011; H02M 1/0029
See application file for complete search history.

(56) References Cited

U.S. PATENT DOCUMENTS 9,634,560 B2 * 4/2017 Ek ........................... H02M 3/07
9,785,177 B1 * 10/2017 Coimbra ............. H03F 3/45475
(Continued)

FOREIGN PATENT DOCUMENTS

CN       101989454 A      3/2011
CN       105573396 A      5/2016
(Continued)

OTHER PUBLICATIONS

"International Application Serial No. PCT/CN2020/139546, International Search Report dated Sep. 24, 2021", w/ English Translation, (Sep. 24, 2021), 5 pgs.
(Continued)

*Primary Examiner* — Jason M Crawford
(74) *Attorney, Agent, or Firm* — Schwegman Lundberg & Woessner, P.A.

(57) ABSTRACT

Provided is a signal driving system with a constant slew. The signal driving system with the constant slew includes: a step voltage generation unit configured to provide multiplex arithmetic gradient voltage signals; a multiplexer, wherein an input end of the multiplexer is connected to the step voltage generation unit to receive the multiplex arithmetic gradient voltage signals, and another input end of the multiplexer is connected to a control signal generation unit, and the multiplexer is configured to selectively output the multiplex arithmetic gradient voltage signals under a control of a control signal generated by the control signal generation unit; a voltage following unit connected to the multiplexer, wherein the voltage following unit is configured to serve as an isolation and improve a driving ability; and an output following unit connected to the voltage following unit, wherein the output following unit is configured to drive a subsequently-connected load unit.

9 Claims, 2 Drawing Sheets

(56) References Cited

U.S. PATENT DOCUMENTS

| | | | |
|---|---|---|---|
| 9,946,279 B1* | 4/2018 | Dinh | G05F 1/56 |
| 10,985,644 B1* | 4/2021 | Lam | G06F 1/263 |
| 2014/0070787 A1* | 3/2014 | Arno | H02M 3/02 |
| | | | 323/304 |
| 2016/0056714 A1* | 2/2016 | Ek | H02M 3/1584 |
| | | | 455/73 |
| 2021/0281171 A1* | 9/2021 | Shlomo | G11C 5/145 |
| 2024/0305297 A1* | 9/2024 | Li | H03K 19/0175 |

FOREIGN PATENT DOCUMENTS

| | | | |
|---|---|---|---|
| CN | 106059503 A | 10/2016 | |
| CN | 108462476 A | 8/2018 | |

OTHER PUBLICATIONS

"International Application Serial No. PCT/CN2020/139546, Written Opinion dated Sep. 24, 2021", (Sep. 24, 2021), 3 pgs.

* cited by examiner

SIGNAL DRIVING SYSTEM WITH CONSTANT SLEW RATE

PRIORITY APPLICATIONS

This application is a U.S. National Stage Filing under 35 U.S.C. § 371 from International Application No. PCT/CN2020/139546, filed on Dec. 25, 2020, and published as WO2022/134042 on Jun. 30, 2022; the benefit of priority of which is hereby claimed herein, and which application and publication is hereby incorporated herein by reference in its entirety.

TECHNICAL FIELD

The present disclosure relates to a field of a circuit design technology, and in particular, to a signal driving system with a constant slew rate.

BACKGROUND

A low-speed digital interface in an integrated circuit generally uses high and low levels to represent a logic state of a signal, such as a TTL (transistor transistor logic) level, a CMOS (Complementary Metal Oxide Semiconductor PMOS+NMOS) level, a low-voltage TTL level, a low-voltage CMOS level, etc. When a logic level of the signal changes, a rising edge and a falling edge of the signal are very steep, and an output slew rate is very small, which may cause a high instantaneous power consumption in a circuit and cause a problem of a power supply integrity. A fluctuation of the output slew rate may also cause an impedance discontinuity in a signal transmission process, resulting in an electromagnetic interference, which may eventually cause a failure of a circuit function or a failure of the whole system. The phenomenon is becoming more and more obvious with a decrement process size of the integrated circuit.

Therefore, a logic signal driving circuit with a constant output slew rate is urgently required to solve the above-mentioned problems.

SUMMARY

The present disclosure provides a signal driving system with a constant slew rate, including: a step voltage generation unit configured to provide multiplex arithmetic gradient voltage signals; a multiplexer, wherein an input end of the multiplexer is connected to the step voltage generation unit to receive the multiplex arithmetic gradient voltage signals, and another input end of the multiplexer is connected to a control signal generation unit, and the multiplexer is configured to selectively output the multiplex arithmetic gradient voltage signals under a control of a control signal generated by the control signal generation unit; a voltage following unit connected to the multiplexer, wherein the voltage following unit is configured to serve as an isolation and improve a driving ability; and an output following unit connected to the voltage following unit, wherein the output following unit is configured to drive a subsequently-connected load unit.

In embodiments of the present disclosure, the step voltage generation unit includes a current source, a plurality of equivalent resistances and a signal transistor module that are connected in series.

In embodiments of the present disclosure, a collector of the signal transistor module is connected to a base, and an emitter of the signal transistor module is grounded.

In embodiments of the present disclosure, the voltage following unit is an operational amplifier in a form of a voltage follower, and an input voltage of the voltage following unit is consistent with an output voltage of the voltage following unit.

In embodiments of the present disclosure, the output following unit is a current source biased emitter follower composed of a driving transistor module and a bias current source.

In embodiments of the present disclosure, an input end of the output following unit is connected to a base of the driving transistor module, an output end of the output following unit is connected to an emitter of the driving transistor module, and the output following unit has an ability of driving a heavy load.

In embodiments of the present disclosure, it is satisfied that a ratio $M_1/M_0$ of a unit numerical value of the driving transistor module to a unit numerical value of the signal transistor module is equal to a ratio $I_1/I_0$ of a current value of the bias current source and a current value of the current source, wherein, $$\frac{M_1}{M_0} = \frac{I_1}{I_0},$$

so that an emitter junction voltage of the signal transistor module is the same as an emitter junction voltage of the driving transistor module.

In embodiments of the present disclosure, the control signal generation unit includes a rising edge detection module, a falling edge detection module and a reversible counter, and the control signal required for the multiplexer is generated by detecting a rising edge of an input signal or a falling edge of the input signal.

In embodiments of the present disclosure, a number of equivalent resistors is n−1, when the rising edge of the input signal of the control signal generation unit arrives, a final output voltage signal of the signal driving system starts to increment from 0V with an increment step of $_AV$, until the final output voltage signal is $(n-1)_AV$, wherein a low level of the output voltage signal is 0V and a high level of the output voltage signal is $(n-1)_AV$, and when n approaches infinity, a slew rate SlewRate of the output voltage signal is:

$$SlewRate = \frac{_AV}{T};$$

where T is a clock cycle, and the signal driving system is capable of acquiring output voltage signals with different slopes by providing parameters of the clock cycle, $_AV$ and n and a high-level voltage, so as to meet different application requirements.

BRIEF DESCRIPTION OF THE DRAWINGS

Accompanying drawings are used to provide a further understanding for the present disclosure and constitute a part of the specification. The present disclosure will be described with reference to the accompanying drawings and following detailed descriptions, and do not constitute a limitation of the present disclosure.

DESCRIPTION OF SYMBOLS $I_0$—current value $I_0$ of current source; $C_0, C_1, C_2 \ldots C_{n-1}$—n voltage output nodes of step voltage generation unit; $A_0, A_1, A_2 \ldots A_{n-2}, A_{n-1}$—n input ends of multiplexer; $Q_0$—signal transistor module; CON—control signal; OUT—output signal port of multiplexer; $V_A$—output voltage signal of multiplexer; $V_B$—output voltage signal of voltage following unit; $I_1$—bias current; $Q_1$—driving transistor module; $C_L$—load capacitance; $R_L$—load resistance; $V_{OUT}$—final output voltage signal; CLK—clock signal; IN—input logic signal; INC—increment pulse signal; DEC—decrement pulse signal.

DETAILED DESCRIPTION OF EMBODIMENTS

The present disclosure provides a signal driving system with a constant slew rate. An increment step voltage output is sequentially selected based on a clock cycle by using a control signal generation unit, and an output slew rate is constant and controllable and may not change with a load.

In a process of realizing the present disclosure, the inventors have found that connecting a resistor in series or in parallel at a signal output node may reduce a slew rate of an output signal, acquire a slowly changing rise time or fall time, and improve an integrity of a power supply and reduce an electromagnetic compatibility. However, the method may increase a cost of circuit manufacturing, and may be easily changed by an integrated circuit technology, or by a temperature and a power supply voltage. Therefore, a step voltage generation unit and an output following unit are skillfully designed, so that emitter junction voltages which are different from process and temperature change trends may cancel each other out to acquire a consistent output signal, and a chip production yield may be improved.

In order to make the objectives, technical solutions and advantages of the present disclosure clearer, the present disclosure will be further described in detail with reference to specific embodiments and accompanying drawings.

Figure 1:
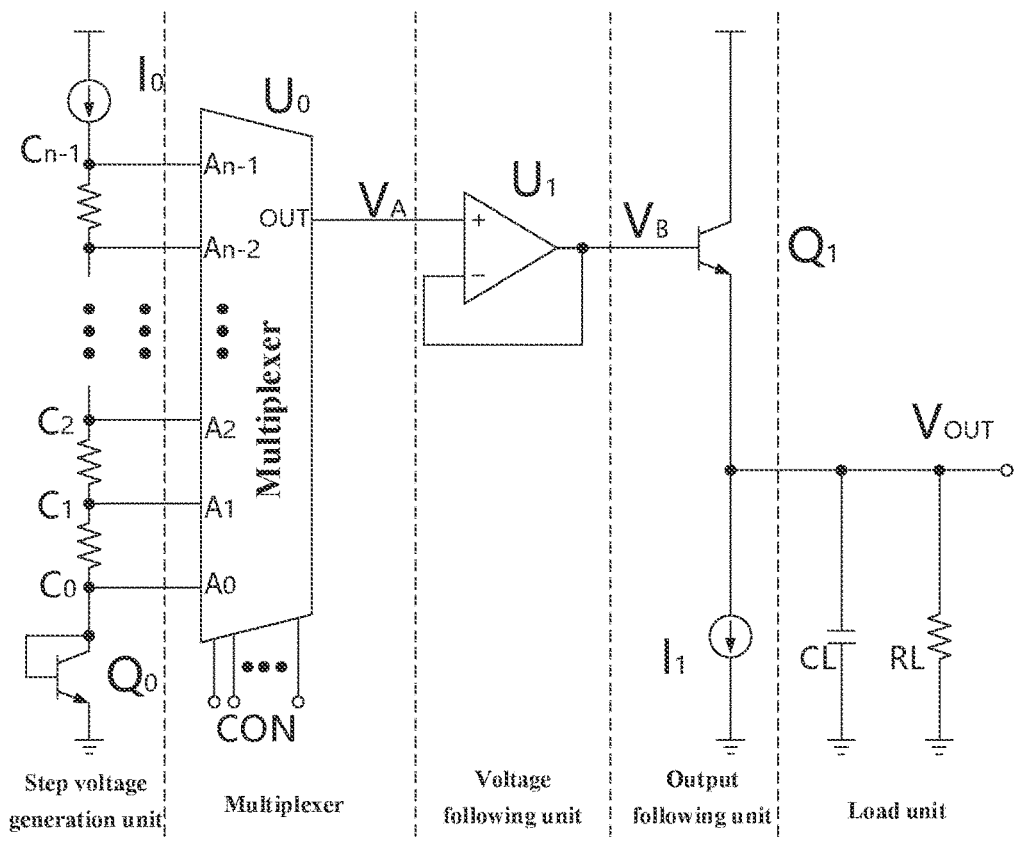
FIG. 1 schematically shows a schematic structural diagram of compositions of a signal driving system with a constant slew rate according to embodiments of the present disclosure.
Figure 2:
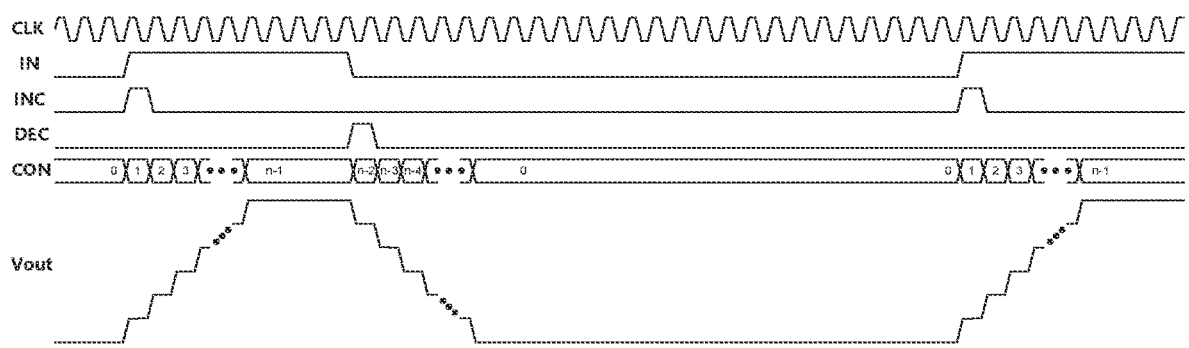
FIG. 2 schematically shows a timing waveform diagram of a signal driving system with a constant slew rate according to embodiments of the present disclosure.
Figure 3:
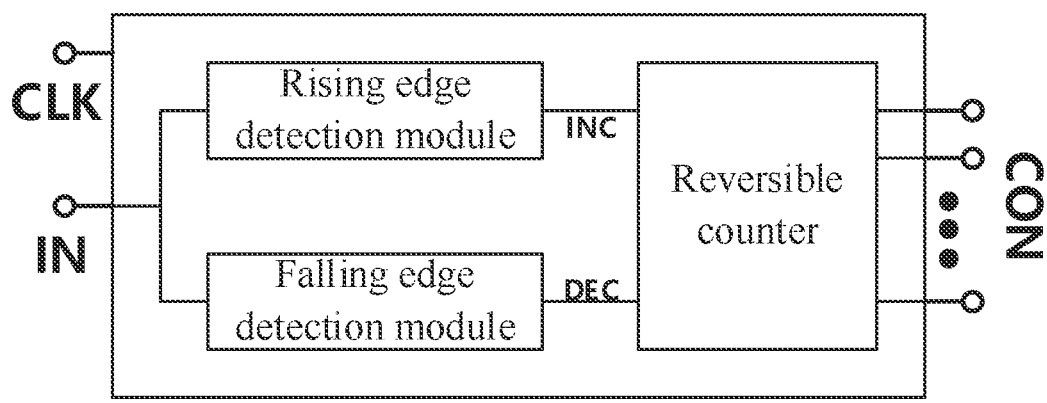
FIG. 3 schematically shows a schematic structural diagram of compositions of a control signal generation unit in a signal driving system with a constant slew rate according to embodiments of the present disclosure.

In embodiments of the present disclosure, a signal driving system with a constant slew rate is provided. As shown in FIG. 1 to FIG. 3, the signal driving system with the constant slew rate includes:

a step voltage generation unit including a current source, a plurality of equivalent resistances, and a signal transistor module that are connected in series, and configured to provide multiplex arithmetic gradient voltage signals;

a multiplexer, wherein an input end of the multiplexer is connected to the step voltage generation unit to receive the multiplex arithmetic gradient voltage signals, and another input end of the multiplexer is connected to a control signal generation unit, and the multiplexer is configured to selectively output the multiplex arithmetic gradient voltage signals under a control of a control signal generated by the control signal generation unit;

a voltage following unit connected to the multiplexer, wherein the voltage following unit is configured to serve as an isolation and improve a driving ability; and an output following unit connected to the voltage following unit, wherein the voltage following unit includes an emitter follower biased by the current source composed of a driving transistor module and a bias current source, and is configured to drive a subsequently-connected load unit.

In embodiments of the present disclosure, the step voltage generation unit includes n−1 resistors with a resistance value of R that are connected in series, a uppermost end of the step voltage generation unit is used to connect a current source with a current value of $I_0$ to a power supply end, and a voltage drop generated by each resistor is $\Delta V = I0*R$; a lowest end of the step voltage generation unit is used to connect the signal transistor module Q0 to the ground, a collector of the signal transistor module Q0 is connected to a base, and an emitter of the signal transistor module Q0 is grounded. A unit numerical value (M value) of the signal transistor module Q0 is M0, and an emitter junction voltage generated under the action of the current source with the current value of I0 is VBE0. n−1 resistors form n voltage output nodes, that is, C0, C1, C2 . . . Cn−1 from bottom to top, and the output voltages are VBE0, VBE0+$\Delta$V, VBE0+2$\Delta$V . . . VBE0+(n−1)$\Delta$V, respectively. (n−1)$\Delta$V is equal to a high-level voltage.

In embodiments of the present disclosure, the multiplexer has n input ends, that is, $A_0, A_1, A_2 \ldots A_{n-2}$ and $A_{n-1}$ respectively, which are connected to $C_0, C_1, C_2 \ldots C_{n-1}$ ports of the step voltage generation unit. An output signal port OUT of the multiplexer is connected to an input end of the voltage following unit, and a control signal input port of the multiplexer is connected to an output end of the control signal generation unit. When an input control signal CON=0, the output signal port OUT is connected to $A_0$, when CON=1, the output signal port OUT is connected to $A_1$, and so on. When the control signal CON=n−1, the output signal port OUT is connected to the input end $A_{n-1}$. Therefore, when the control signal CON gradually increments from 0 to n−1, an output voltage signal $V_A$ of the multiplexer increments from $V_{BE0}$ to $V_{BE0}$+(n−1)$\Delta$V in a step of $_A$V. If n is large enough, it may be approximately considered that $V_A$ increments linearly from $V_{BE0}$ to $V_{BE0}$+(n−1)$\Delta$V in the process.

The voltage following unit is configured to isolate a front-stage circuit and a back-stage circuit and provide a great driving ability to drive the back-stage circuit. An input voltage of the voltage following unit is consistent with an output voltage of the voltage following unit. The voltage following unit may be composed of an operational amplifier connected in a form of a voltage follower, an input end of which is connected to the output signal port OUT of the multiplexer, and an output end of which is connected to an input end of a subsequently-connected output following unit. Due to a large input impedance voltage of a following circuit, the following circuit may not affect the above-mentioned multiplexer and the above-mentioned step voltage generation unit, and due to a small output impedance of the following circuit, the following circuit may provide a great driving ability to drive the back-stage circuit, so that the isolation of the front-stage circuit and the back-stage circuit may be achieved. An output voltage signal $V_B$ of the voltage following unit is consistent with the input voltage signal $V_A$ of the voltage following unit.

The output following unit includes an emitter follower biased by the current source composed of a driving transistor module and a bias current source. An input end of the output following unit is a base of the driving transistor module $Q_1$ and is connected to an output end of the voltage following unit, and an output end of the output following unit is an emitter of the driving transistor module $Q_1$, so that the output following unit has an ability of driving a heavy load. A unit numerical value of the driving transistor module $Q_1$ is $M_1$, and a voltage drop of an emitter junction of the driving transistor module is $V_{BE1}$ under an action of the bias current source with a bias current of $I_1$.

The output following unit is connected to a subsequently-connected load unit, the load unit includes a load capacitor $C_L$ and a load resistor $R_L$, and a final output voltage signal is $V_{OUT}$. According to the characteristics of the circuit, it may be obtained that:

$$V_{OUT} = V_B - V_{BE1};$$

When the input voltage signals $V_B$ for the output following unit are $V_{BE0}$, $V_{BE0}+\Delta V$, $V_{BE0}+2_\Delta V$ ... $V_{BE0}+(n-1)_\Delta V$, respectively, and the output voltage signals $V_{OUT}$ of the output following unit are $V_{BE0}-V_{BE1}$, $V_{BE0}-V_{BE1}+_\Delta V$, $V_{BE0}-V_{BE1}+2_\Delta V$ ... $V_{BE0}-V_{BE1}+(n-1)_\Delta V$, respectively.

Since the voltage drop of the emitter junction of the transistor module may change with current, temperature and process deviations, and changing trends ae not necessarily the same for transistors with different parameters, for the above-mentioned signal transistor module $Q_0$ and the above-mentioned driving transistor module $Q_1$, the signal transistor module $Q_0$ in the step voltage generation unit is mainly used for a signal generation, without a driving ability, and a size of the signal transistor module $Q_0$ should not be too large, and a current flowing through $Q_0$ should be as small as possible to avoid a power consumption waste. The driving transistor module $Q_1$ in the output following unit is configured to drive a heavy load and has a large size, so the driving transistor module $Q_1$ inevitably has a large bias current. Therefore, the two transistors have different sizes and different bias currents. By making a ratio $M_1/M_0$ of M value of the driving transistor module $Q_1$ to M value of the signal transistor module $Q_0$ equal to a ratio $I_1/I_0$ of a current value of the bias current source and a current value of the current source, i.e., $$\frac{M_1}{M_0} = \frac{I_1}{I_0}.$$

an effect that an emitter junction voltage of the signal transistor module $Q_0$ is the same as an emitter junction voltage of the driving transistor module $Q_1$ may be obtained, that is, $V_{BE0}=V_{BE1}$. Combined with the above-mentioned analysis, when the voltage signals $V_B$ input by the output following unit are: $V_{BE0}$, $V_{BE0}+_\Delta V$, $V_{BE0}+2_\Delta V$, ... $V_{BE0}+(n-1)_\Delta V$, respectively, the output signals $V_{OUT}$ of the output following unit are: $0$, $_\Delta V$, $2_\Delta V$, ... $(n-1)_\Delta V$, respectively.

The control signal generation unit includes a rising edge detection module, a falling edge detection module and a reversible counter, wherein a cycle of an input clock signal (CLK) is T, and the control signal required for the multiplexer is generated by detecting a rising edge of an input logic signal (IN) or a falling edge of the input logic signal (IN). When the system inputs the input logic signal IN into the control signal generation unit, the rising edge detection module gives an increment pulse signal (INC) after detecting the rising edge of the input logic signal IN. Under a trigger of the pulse, the reversible counter starts to increment from 0 and increases by 1 every clock cycle until n−1, and then remains unchanged. When the falling edge of the IN arrives, the falling edge detection module gives a decrement pulse signal (DEC). At this time, the reversible counter starts to decrement from n−1 and decreases by 1 every clock cycle until 0.

Combined with the above-mentioned analysis, in response to the rising edge of the input signal arriving, a final output voltage signal $V_{OUT}$ of the circuit starts to increment from 0V, with an increment step of $_\Delta V$, until $(n-1)_\Delta V$. A low level of the output signal is 0V, and a high level of the output signal is $(n-1)_\Delta V$. In response to n being large enough, a slew rate SlewRate of the output signal may be approximately considered as:

$$SlewRate = \frac{_\Delta V}{T};$$

where T is a clock cycle, and the circuit may is capable of acquiring output voltage signals with different slopes by providing parameters of the clock cycle, $_\Delta V$ and n and a high-level voltage, so as to meet different application requirements.

So far, embodiments of the present disclosure have been described in detail with reference to the accompanying drawings. It should be noted that implementations that are not shown or described in the accompanying drawings or the text of the specification are all known to those skilled in the art and have not been described in detail. In addition, the above-mentioned definitions of elements and methods are not limited to the specific structures, shapes or ways mentioned in the embodiments, and may be simply changed and replaced by those skilled in the art.

According to the above-mentioned descriptions, those skilled in the art should have a clear understanding for the signal driving system with the constant slew rate of the present disclosure.

To sum up, the present disclosure provides a signal driving system with a constant slew rate, including a step voltage generation unit, a multiplexer, a voltage following unit, an output following unit, and a control signal generation unit. The step voltage generation unit generates a multiplex step voltage and superposes a $V_{BE0}$ voltage of a signal transistor module. The multiplexer selects one of multiplex step voltages to output under a control of the control signal. The voltage follower is configured to provide a great driving ability to drive a back-stage output following unit. The output following unit provides a voltage driving ability of 1:1, and at the same time subtracts a voltage ($V_{BE1}$) consistent with a $V_{BE0}$ value superimposed in the step voltage generation unit and finally drives the load unit. The present disclosure may achieve a function that the output signal rises or falls in a fixed step, so as to acquire a constant output slew rate that may not change with a load, which may effectively reduce a signal electromagnetic interference.

The control signal generation unit in the signal driving system with the constant slew rate according to the present disclosure sequentially selects an increment step voltage output based on the clock cycle, and an output slew rate is constant and controllable and may not change with a load, which may well optimize the step voltage generation unit and the output following unit, so that emitter junction voltages which are different from process and temperature change trends may cancel each other out to acquire a consistent output signal, and a chip production yield may be improved.

Those skilled in the art may clearly understand that for the convenience and conciseness of the descriptions, only a division of the above-mentioned functional devices is taken as an example. In a practical application, the above-mentioned functional allocation may be completed by different functional modules as required, that is, an internal structure of the signal driving system is divided into different functional modules to complete all or part of the above-mentioned functions. The specific working process of the above-mentioned signal driving system will not be repeated here, please refer to the corresponding process in the above-mentioned method embodiments.

Finally, it should be noted that: the above-mentioned embodiments are only used to describe the technical solution of the present disclosure, and are not intended to limit the technical solution of the present disclosure. Although the present disclosure has been described in detail with reference to the above-mentioned embodiments, those skilled in the art will appreciate that they may still modify the technical solution described in the above-mentioned embodiments, or make equivalent substitutions for some or all of technical features. Without a conflict, the features in embodiments of the present disclosure may be freely combined. However, the modifications or substitutions may not make the essence of the corresponding technical solution depart from the scope of the technical solution of various embodiments of the present disclosure.

What is claimed is:

1. A signal driving system with a constant slew rate, comprising:
    a step voltage generation unit configured to provide multiplex arithmetic gradient voltage signals;
    a multiplexer, wherein an input end of the multiplexer is connected to the step voltage generation unit to receive the multiplex arithmetic gradient voltage signals, and another input end of the multiplexer is connected to a control signal generation unit, and the multiplexer is configured to selectively output the multiplex arithmetic gradient voltage signals under a control of a control signal generated by the control signal generation unit;
    a voltage following unit connected to the multiplexer, wherein the voltage following unit is configured to serve as an isolation and improve a driving ability; and
    an output following unit connected to the voltage following unit, wherein the output following unit is configured to drive a subsequently-connected load unit.

2. The signal driving system with the constant slew rate according to claim 1, wherein the step voltage generation unit comprises a current source, a plurality of equivalent resistances and a signal transistor module that are connected in series.

3. The signal driving system with the constant slew rate according to claim 2, wherein a collector of the signal transistor module is connected to a base, and an emitter of the signal transistor module is grounded.

4. The signal driving system with the constant slew rate according to claim 3, wherein the voltage following unit is an operational amplifier in a form of a voltage follower, and an input voltage of the voltage following unit is consistent with an output voltage of the voltage following unit.

5. The signal driving system with the constant slew rate according to claim 4, wherein the output following unit is a current source biased emitter follower by a composed of a driving transistor module and a bias current source.

6. The signal driving system with the constant slew rate according to claim 5, wherein an input end of the output following unit is connected to a base of the driving transistor module, an output end of the output following unit is connected to an emitter of the driving transistor module, and the output following unit has an ability of driving a heavy load.

7. The signal driving system with the constant slew rate according to claim 1, wherein it is satisfied that a ratio $M_1/M_0$ of a unit numerical value of the driving transistor module to a unit numerical value of the signal transistor module is equal to a ratio $I_1/I_0$ of a current value of the bias current source and a current value of the current source, wherein, $$\frac{M_1}{M_0} = \frac{I_1}{I_0},$$

so that an emitter junction voltage of the signal transistor module is the same as an emitter junction voltage of the driving transistor module.

8. The signal driving system with the constant slew rate according to claim 1, wherein the control signal generation unit comprises a rising edge detection module, a falling edge detection module and a reversible counter, and the control signal required for the multiplexer is generated by detecting a rising edge of an input signal or a falling edge of the input signal.

9. The signal driving system with the constant slew rate according to claim 8, wherein a number of equivalent resistors is n−1, when the rising edge of the input signal of the control signal generation unit arrives, a final output voltage signal of the signal driving system starts to increment from 0V with an increment step of $_\Delta V$, until the final output voltage signal is $(n-1)_\Delta V$, wherein a low level of the output voltage signal is 0V and a high level of the output voltage signal is $(n-1)_\Delta V$, and when n approaches infinity, a slew rate SlewRate of the output voltage signal is:

$$SlewRate = \frac{\Delta V}{T};$$

where T is a clock cycle, and the signal driving system is capable of acquiring output voltage signals with different slopes by providing parameters of the clock cycle, $_\Delta V$ and n and a high-level voltage, so as to meet different application requirements.

* * * * *